INVENTORS
GEORGE D. BRUCE
ROBERT A. HENLE
JAMES L. WALSH
BY P. E. Henninger
ATTORNEY

INVENTORS
GEORGE D. BRUCE
ROBERT A. HENLE
JAMES L. WALSH

BY P. E. Henninger
ATTORNEY

United States Patent Office 2,888,578
Patented May 26, 1959

2,888,578

TRANSISTOR EMITTER-FOLLOWER CIRCUITS

George D. Bruce, Wappingers Falls, and Robert A. Henle and James L. Walsh, Hyde Park, N.Y., assignors to International Business Machines Corporation, New York, N.Y., a corporation of New York Application September 30, 1954, Serial No. 459,382

4 Claims. (Cl. 307—88.5)

The present invention relates to transistor circuits, and especially to circuits in which the transistor operates as an emitter follower, i.e., the potential at the emitter follows the variations in the potential at an input terminal connected to the base.

In many instances, it is desirable to connect a signal source having a high impedance to a signal utilizing device or load having a low impedance. It is desirable in such cases to couple the source and load together through an impedance matching circuit. The emitter follower transistor circuit described herein may be used for that purpose, but its utility is not necessarily limited to that purpose.

Logical circuits may be defined as circuits having a plurality of sets of input terminals and a single set of output terminals, which produce a signal at the output terminals only in response to the existence of a predetermined combination of signals at the input terminals. Typically, a logical circuit may be an And or an Or circuit. An And circuit produces an output signal when signals are received simultaneously at all the input terminals, while an Or circuit produces an output signal in response to an input signal at any one of its sets of input terminals.

It sometimes is desirable to have a logical circuit respond to input signals from sources whose impedances differ one from another, or whose impedances differ substantially from the input impedances of the circuit to which the output signals are to be directed. The present invention includes within its scope the provision of logical circuits employing the emitter follower principle, by which such signal sources and signal utilizing devices having different impedances may be connected together.

The foregoing and other objects of the invention are attained in the circuits described herein. In the simple emitter follower circuit, a PNP junction transistor has a high impedance signal generator connected in series with its base through a resistor. The emitter is strongly positively biased by means of a battery and a resistor. The collector is connected to a negative bias source of electrical energy. The positive bias on the emitter is sufficiently strong so that the transistor conducts continuously. A resistor connects the base and the collector electrode, in order to insure that the base is always at a lower potential than the emitter, thereby insuring that the transistor is continuously conductive. When a positive signal is received at the base input, the base potential is shifted in the positive direction, and since the emitter to base impedance is very low, the emitter potential is similarly shifted.

A modification of the invention is a logical circuit comprising two transistors having their emitters and collectors connected in parallel and having separate signal generators connected to their bases.

Other objects and advantages of the invention will become apparent from a consideration of the following specification and claims, taken together with the accompanying drawing.

FIGURE 1

Figure 1:
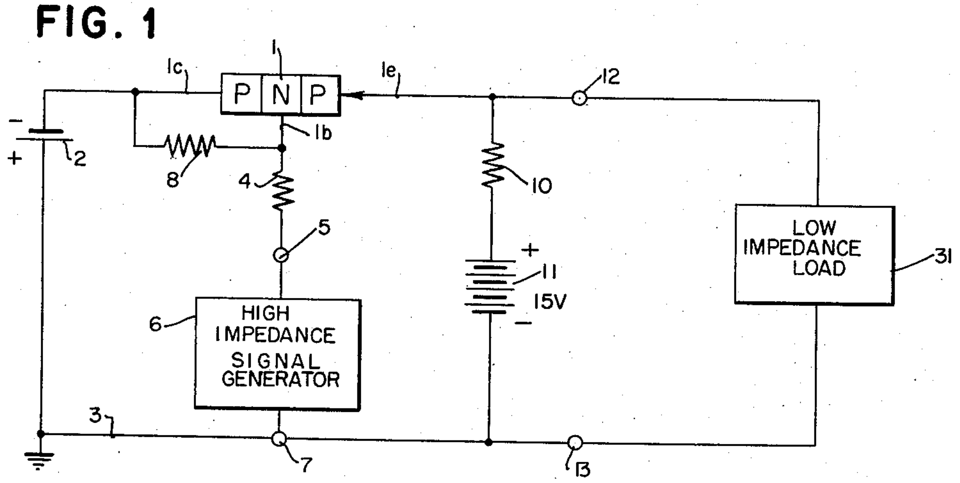
Fig. 1 is a wiring diagram of an emitter follower circuit embodying the invention.

The emitter follower circuit shown in this figure includes a PNP junction transistor 1 having an emitter electrode 1*e*, a base electrode 1*b*, and a collector electrode 1*c*. Collector 1*c* is connected through a biasing battery 2 to a grounded wire 3. Base electrode 1*b* is connected through a resistor 4 to an input terminal 5. A signal generator 6 is connected between the input terminal 5 and a grounded input terminal 7. The signal generator 6 may be of any suitable construction and by way of example is indicated as being shiftable between a "no signal" condition wherein terminal 5 is at a potential of minus 5 volts with respect to terminal 7, and a "signal" condition wherein the input terminals 5 and 7 are at the same potential.

The emitter 1*e* is connected in series with a resistor 10 and an emitter current supply battery 11, whose opposite terminal is grounded. Output terminals 12 and 13 are connected respectively to the emitter 1*e* and to ground.

When the signal generator 6 is in its "no signal" condition, i.e., with the input signal at its most negative value, current flows continuously from the battery 11 through resistor 10, emitter 1*e*, base 1*b*, resistor 4 and signal generator 6 back to the negative terminal at battery 11. Current also flows from emitter 1*e* through collector 1*c* and thence through battery 2 to ground. Since the base-collector impedance may be rather high, a resistor 8 is connected between base 1*b* and collector 1*c*, to insure a continuous flow of current through the emitter 1*e* and base 1*b*. This is turn ensures that there is a small potential drop between the emitter and the base, sufficient to keep the base at a potential lower than the emitter. The transistor is thereby maintained conductive. The resistor 8 also is effective to protect transistor 1 in the event that base 1*b* should become disconnected. In such an event, if resistor 8 were not provided, transistor 1 might be subjected to an emitter-collector potential higher than it can withstand, with resultant damage to the transistor.

Under the conditions just described, the base 1*b* and the emitter 1*e* are both substantially at the same potential, although, as stated, the emitter is slightly more positive than the base. Both the emitter and the base are positive with respect to the collector. Substantially all the potential drop in the emitter-base circuit takes place through the resistors 10 and 4.

If a signal is received from signal generator 6, i.e., if terminal 5 is shifted to substantially ground potenital, then the potential of base 1*b* shifts toward ground potential by about 5 volts. The potential of emitter 1*e* follows that change in the base potential, since the potential drop between emitter and base remains low. When the signal generator 6 is restored to its "no signal" condition, the potential of emitter 1*e* again follows.

The circuit described causes the potential at the output terminals 12 and 13 to follow the changes in potential at the signal generator 6. The circuit is essentially a grounded collector amplifier circuit, which is well-known to have high input impedance and low output impedance. It may therefore be used to connect a high impedance signal source 6 to a low impedance load 31.

Resistor 4 functions primarily as a voltage divider in cooperation with the base-emitter impedance and also in cooperation with resistor 8 and battery 2, to determine the potential of base *1b*. It may conceivably be omitted in a circuit where it is not necessary that the output potential closely follow the input potential. Resistor 4 may also be necessary to isolate the base from the input in instances where the rate of rise of the input signal is high. In such an arrangement, the input impedance of the transistor to the transient components of the input signal may be undesirably low, and the resistor 4 increases the impedance to such transients.

FIGURE 2

Figure 2:
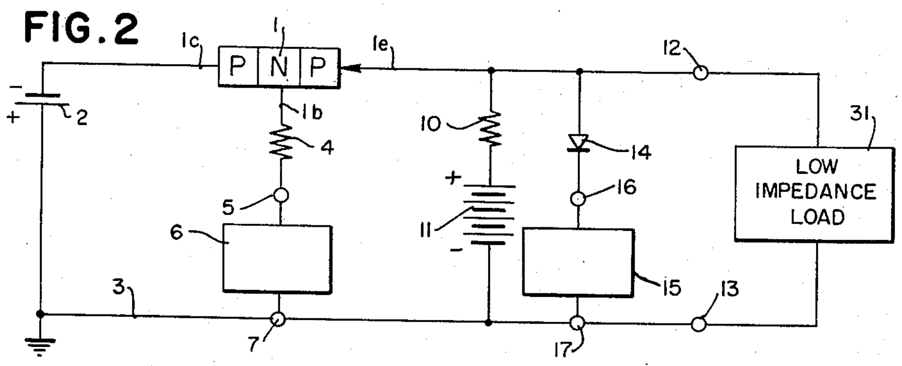
Fig. 2 is a wiring diagram of a logical circuit.

This figure illustrates an And circuit which includes most of the circuit elements of Fig. 1. These elements have been given the same reference numerals in Fig. 2. Fig. 2 additionally includes a second input circuit connected between the emitter *1e* and ground, and comprising a diode 14 and a signal generator 15 which must be a low impedance generator as compared to the high impedance signal generator 6, but whose "no signal" and "signal" terminal potentials are the same as those of generator 6, i.e., −5 and 0 volts respectively.

OPERATION OF FIGURE 2

When no signal is received from either of the generators 6 and 15, then the output terminal 12 remains at a negative potential only slightly more positive than minus 5 volts, substantially the same as in the circuit of Fig. 1. If a positive signal is received from generator 6 only, the potential of base electrode *1b* tends to go to 0 volts and the potential of emitter *1e* tends to follow. However, diode 14 and the potential of generator 15 now form an effective clamp circuit which may be traced from the positive terminal of battery 11 through resistor 10, diode 14 in its low impedance direction, signal generator 15 and the grounded wire 3. The potential of signal generator 15 is then the same as the Off potential of signal generator 6, i.e., minus 5 volts, so that output terminal 12 remains at minus 5 volts. Emitter *1e* is also at minus 5 volts, so the transistor is cut off.

If a signal appears at the terminals of generator 15, while there is no signal at the generator 6, then the potential at emitter *1e* is lower than that at terminal 16, and the diode 14 is poled to block any flow of current from the generator 15 toward emitter *1e* and terminal 12. The conditions at output terminal 12 therefore remain the same as though no signal were received from generator 15.

When signals are received from generators 6 and 15 simultaneously, the potential of emitter electrode *1e* tends to go to 0 volts, which is substantially the same as the potential at input terminal 16 (0 volts), and there is then essentially no potential drop across the diode 14. This shift in the potential of terminal 12 produces an output pulse at the terminals 12 and 13.

Summarizing, it may be seen that input signals at either generator 6 or generator 15 separately produce no output pulse, but that signals at both generators 6 and 15 simultaneously produce an output pulse. This is typical And circuit operation. The circuit of Fig. 2 also permits interconnection of a high impedance signal source 6 with a low impedance source 15 and a load 31.

While the circuit of Fig. 2 is shown with only two inputs, it will readily be understood that the circuit may be expanded to include more than two inputs. Such an expansion might take the form of additional transistors connected in parallel with transistor 1, and each with a separate base input, or alternatively it might take the form of additional diodes and inputs connected in parallel with diode 14, or both alternatives might be employed. The particular alternative selected will of course depend upon the number of high impedance signal sources (requiring transistor inputs) involved and the number of low impedance sources (requiring diode inputs).

FIGURE 3

This figure illustrates a logical circuit generally similar in function to the circuit of Fig. 2. The circuit of Fig. 3 includes two transistors 18 and 19, having emitters *18e*, *19e*, base electrodes *18b*, *19b*, and collector electrodes *18c*, *19c*.

The collector electrodes *18c* and *19c* are connected in parallel to a common biasing battery 20, whose opposite terminal is connected to a grounded wire 21.

Emitter electrodes *18e* and *19e* are connected in parallel to an emitter supply branch including a resistor 22 and a battery 23. Base *18b* is connected through a resistor 24 and a signal generator 25 to the grounded wire 21. Base electrode *19b* is connected through a resistor 26 and a signal generator 27 to the grounded wire 21. A resistor 28 connects the base *18b* with collector *18c*. A resistor 29 connects the base *19b* with collector *19c*. The generators 25 and 27 may be high impedance signal sources.

An output terminal 30 is connected to emitters *18e* and *19e* and a low impedance load 31 is connected between terminal 30 and a grounded output terminal 32.

OPERATION OF FIGURE 3

Figure 3:
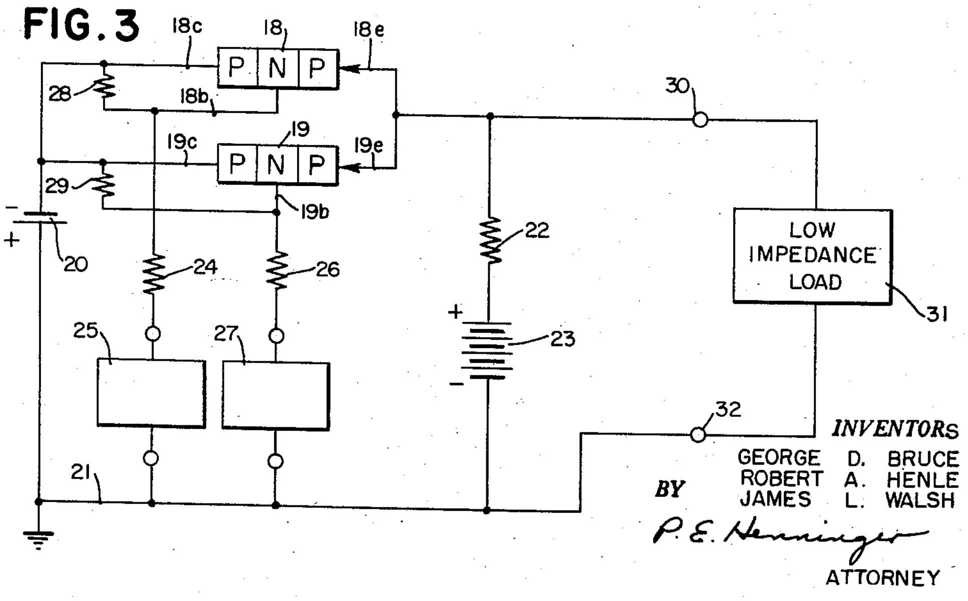
Fig. 3 is a wiring diagram of a different form of logical circuit based on the emitter follower circuit of Fig. 1.
Figure 4:
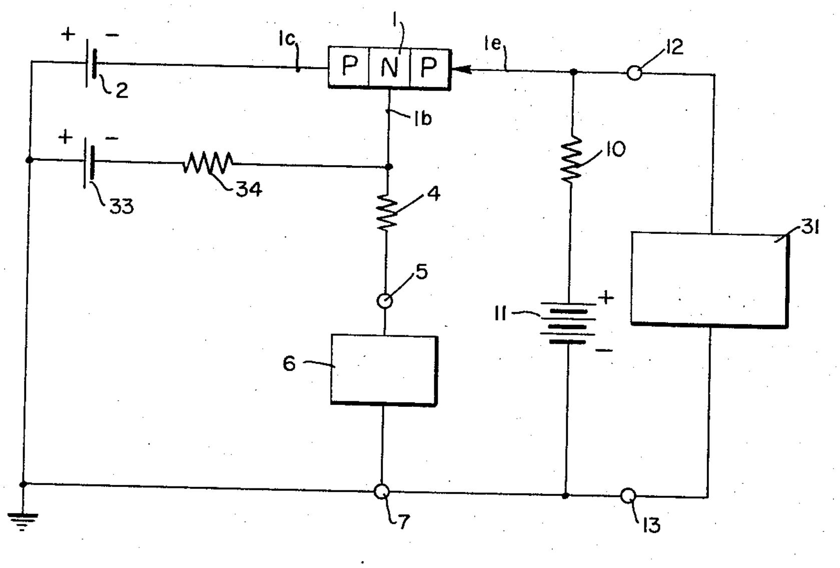
Figs. 4 and 5 are wiring diagrams of modifications of the circuit of Fig. 1.
Figure 5:
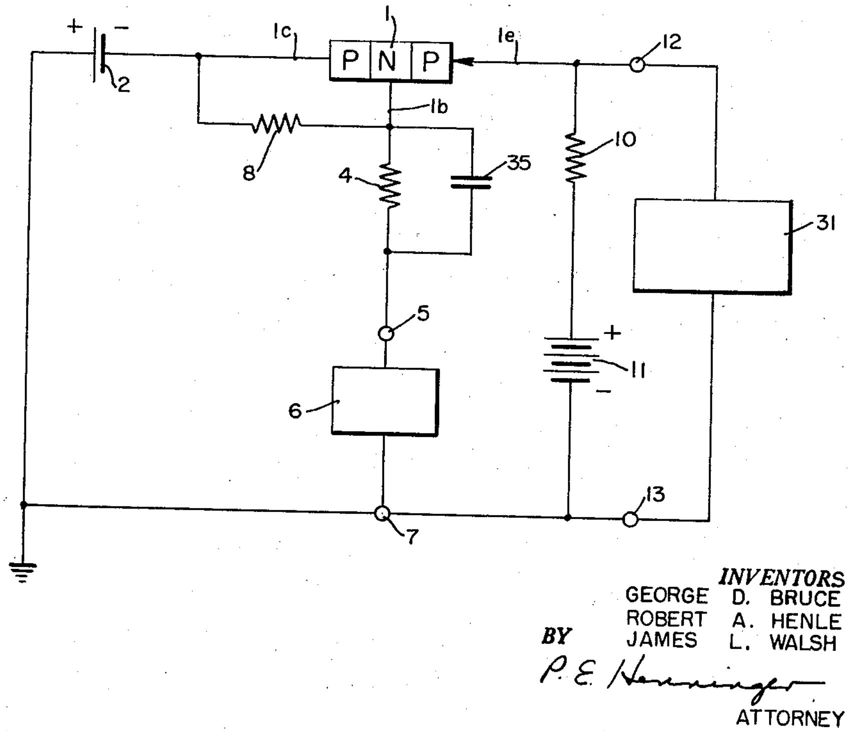

The operation of either one of the transistors 18 and 19 in Fig. 3 is substantially the same as that of transistor 1 in Fig. 1.

Under no signal conditions, both the bases *18b* and *19b* are slightly more positive than −5 volts, and the emitters *18e* and *19e* are slightly more positive than the bases. Both transistors 18 and 19 are conductive.

If a signal is received at generator 25, or generator 27 only, then the base electrode of that transistor is raised in potential. However, the current flowing through the other transistor maintains both emitters substantially below ground potential, so that the one transistor which received the signal is cut off, but the potential of output terminal 30 does not change substantially. If a signal appears at both generators 24 and 26, then both the emitters *18e* and *19e* follow the change in potential, which is observed at the output terminal 30.

It may therefore be seen that the circuit of Figure 3 operates as a typical And circuit. It also provides impedance matching functions, since the signal generators 25 and 27 may be high impedance signal sources, while the output impedance between terminals 30 and 32 is relatively low, so that they are adapted to be connected to a low impedance load.

While the circuit of Fig. 3 is shown with only two inputs, it will be readily understood that the circuit may be expanded to include more than two inputs, by providing additional transistors connected in parallel with the transistors 18 and 19, one transistor for each such additional input.

FIGURE 4

This figure illustrates a modification of the circuit of Fig. 1, which modification provides that the potential at the emitter, and hence at the output terminal, is the same as the potential at the input terminal 5.

In this circuit, the base *1b* is biased by a battery 33 having its positive terminal connected to ground, and its negative terminal connected through a resistor 34 to the base *1b*. Battery 33 and resistor 34 are chosen so that they produce a potential drop across resistor 4 equal to but opposite in polarity to the potential drop between the emitter *1e* and the base *1b*. Consequently, the emitter potential is equal to the potential at input terminal 5.

Since it is effectively connected between the base *1b* and the collector *1a*, resistor 34 also performs all the current-maintaining and protective functions of resistor 8 of Fig. 1.

FIGURE 5

This circuit illustrates another modification of the circuit of Fig. 1, in which the resistor 4 is provided with a shunt capacitor 35 which is effective to damp out oscillations in the output signal.

The use of the emitter follower circuits described above is not necessarily limited to cases where the input impedance is high or where the load impedance is small. As an example of the use of such a circuit where the load impedance is high, it is desirable in some instances to connect a single emitter follower circuit in cascade with two parallel emitter followers, so as to provide additional power amplification. The first emitter follower would then have a high impedance load. The circuits illustrated are useful for almost any power amplifier purpose where voltage amplification is not required.

While we have shown the use of PNP junction transistors in the circuits illustrated, it will be readily understood that NPN junction transistors may be used with equal facility, by making the necessary changes in the circuit, such as changing the polarities of all the batteries involved.

The following table shows by way of example particular values for the potentials of the various batteries and for the impedances of the various resistors and capacitors in circuits which have been operated successfully. In some cases, the values are also shown on the drawing. These values are set forth by way of example only and the invention is not limited to them nor to any of them. The diode may be assumed to have substantially no impedance in its forward direction and substantially infinite impedance in its reverse direction.

*Table I*

| | | |
|---|---|---|
| Battery 2 | volts | 8 |
| Resistor 4 | ohms | 1K |
| Resistor 10 | do | 3.9K |
| Battery 11 | volts | 15 |
| Resistor 8 | ohms | 100K |
| Battery 20 | volts | 8 |
| Resistor 22 | ohms | 3.9K |
| Battery 23 | volts | 15 |
| Resistor 24 | ohms | 1K |
| Resistor 26 | do | 1K |
| Resistor 28 | do | 100K |
| Resistor 29 | do | 100K |
| Resistor 34 | do | 47K |
| Capacitor 35 | mmf | 680 |

While we have shown and described certain preferred embodiments of our invention, other modifications thereof will readily occur to those skilled in the art, and we therefore intend our invention to be limited only by the appended claims.

What is claimed is:

1. A transistor circuit comprising a body of semiconductive material having a central region of one extrinsic conductivity type and two opposite end regions of the opposite extrinsic conductivity type, said regions being separated by asymmetrically conductive boundary junctions, a base electrode connected to said central region, emitter and collector electrodes connected to the respective end regions, said body providing asymmetrically conductive paths between said electrodes, a first resistor and a first source of unidirectional electrical energy connected in series between said emitter electrode and a common junction, said first source being poled to bias the asymmetric emitter-base impedance forwardly, a second resistor and a source of square wave signals connected in series between the base electrode and the common junction, a second source of unidirectional electrical energy connected between said collector electrode and the common junction, said second source being poled to bias the asymmetric collector-base impedance reversely, a third resistor having one terminal connected to a junction with said second resistor and said base electrode, and means connecting the opposite terminal of the third resistor to said collector electrode, said third resistor and said connecting means by-passing the asymmetric collector-base impedance, said second and third resistors cooperating as a voltage divider to determine the base electrode potential in the absence of an input signal, said first and second resistors cooperating with said first source to ensure a continuous flow of current in the forward direction through said emitter-base impedance, whereby said emitter electrode closely follows the variations in potential at the base electrode due to variations in the potential at the signal source.

2. A transistor circuit as defined in claim 1, in which said connecting means includes a third source of unidirectional electrical energy connected between the opposite terminal of the third resistor and the common junction, and said second source; and in which said third source and said second and third resistors are proportioned to maintain a potential drop across said second resistor substantially equal to the potential drop across the asymmetric emitter-base impedance, so that the potential between the emitter electrode and the common junction is substantially equal to the potential across the signal source.

3. A transistor circuit as defined in claim 1, including a capacitor connected in parallel with said second resistor.

4. A transistor circuit as defined in claim 1, in which said connecting means includes a direct conductive connection between the other terminal of the third resistor and the collector electrode.

References Cited in the file of this patent

UNITED STATES PATENTS

| | | |
|---|---|---|
| 2,535,377 | Titterton | Dec. 26, 1950 |
| 2,627,039 | MacWilliams | Jan. 27, 1953 |
| 2,670,445 | Felker | Feb. 23, 1954 |

FOREIGN PATENTS

| | | |
|---|---|---|
| 150,221 | Australia | Feb. 23, 1950 |

OTHER REFERENCES

Article: "Transistor Cathode Follower," by A. H. Hellmers, Radio and Television News, October 1953, page 169.

Turner, "Transistors Theory and Practice," 1954, Gernsback Publications Inc.

Electronics, August 1953, pages 170 to 173.

Electronics, October 1953, page 182.